(12) United States Patent
Kim et al.

(10) Patent No.: US 7,750,453 B2
(45) Date of Patent: Jul. 6, 2010

(54) SEMICONDUCTOR DEVICE PACKAGE WITH GROOVE

(75) Inventors: Hye-Jin Kim, Seoul (KR); Kyung-Man Kim, Chungcheongnam-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 149 days.

(21) Appl. No.: 11/855,958

(22) Filed: Sep. 14, 2007

(65) Prior Publication Data

US 2008/0067660 A1 Mar. 20, 2008

(30) Foreign Application Priority Data

Sep. 20, 2006 (KR) .................. 10-2006-0091386

(51) Int. Cl.
*H01L 23/02* (2006.01)
(52) U.S. Cl. ............... 257/686; 257/690; 257/E23.141
(58) Field of Classification Search ......... 257/678–787, 257/E23.141
See application file for complete search history.

(56) References Cited

U.S. PATENT DOCUMENTS

| 6,448,507 | B1 | 9/2002 | Fontecha et al. | |
| 6,853,089 | B2 * | 2/2005 | Ujiie et al. | 257/783 |
| 7,518,250 | B2 * | 4/2009 | Shimanuki | 257/784 |
| 2006/0091523 | A1 * | 5/2006 | Shimanuki | 257/698 |

FOREIGN PATENT DOCUMENTS

| JP | 2003-92374 | 3/2003 |
| JP | 2006-100385 | 4/2006 |
| KR | 8-153752 | 6/1996 |
| KR | 2003-0024620 | 3/2003 |
| KR | 10-2006-0017294 | 2/2006 |

OTHER PUBLICATIONS

English language abstract of Korean Publication No. 2003-0024620.
English language abstract of Japanese Publication No. 2003-92374.
English language abstract of Korean Publication No. 10-2006-0017294.

* cited by examiner

*Primary Examiner*—Thanh V Pham
*Assistant Examiner*—Marvin Payen
(74) *Attorney, Agent, or Firm*—Myers Bigel Sibley & Sajovec, PA

(57) ABSTRACT

A semiconductor device package includes a semiconductor chip having bonding pads; a printed circuit board (PCB) including an insulation pattern with a groove and bonding electrodes corresponding to the bonding pads, the groove corresponding to the edge of the semiconductor chip and being formed to partially expose a lower portion of the edge of the semiconductor chip; an adhesive material provided for adhering the bottom of the semiconductor chip to the insulation pattern to mount the semiconductor chip on the PCB; bonding wires provided for electrically connecting the bonding electrodes to the corresponding bonding pads; and a molding material provided for sealing the PCB, the semiconductor chip, the adhesive material, and the bonding wires.

16 Claims, 10 Drawing Sheets

SEMICONDUCTOR DEVICE PACKAGE WITH GROOVE

CROSS-REFERENCE TO RELATED APPLICATIONS

This U.S. non-provisional patent application claims priority under 35 U.S.C. §119 to Korean Patent Application No. 10-2006-91386, filed on Sep. 20, 2006, the entirety of which is hereby incorporated by reference.

BACKGROUND

1. Technical Field

The present invention relates to semiconductor device packages and, more specifically, to a semiconductor device package having a groove to prevent void formation between a semiconductor chip and a printed circuit board.

2. Description of the Related Art

With the recent trend toward higher integration of semiconductor devices as well as miniaturization and multi-functionalization of electronic appliances, there is a requirement for a variety of semiconductor device packaging technologies. For instance, mounting of bare chips is often conducted as a high-density mounting method for specific applications that require high performance. However, a bare chip package suffers from problems such as difficulty in quality assurance of the bare chips, establishment and standardization of package technologies by users, and reliability guarantee issues after packaging the bare chips. Therefore, the bare chip package is not widely utilized.

In view of the foregoing requirements, a variety of semiconductor device packages have been developed. One of the semiconductor device packages is a ball grid array package (BGA package), which is a high-density surface mount technology (SMT) package where a printed circuit board (PCB) is used instead of a lead frame and an external lead is not needed. As input/output terminals of a semiconductor device are increasing in number, recent attention has been focused on the BGA package where ball-type protrusive terminals are formed on an entire bottom surface of the semiconductor device package.

Typical configurations of a BGA package are characterized in that, instead of leads, solder balls are used as connection terminals to electrically connect a semiconductor chip and a main board to each other. BGA packages are classified into ceramic BGA (CBGA) packages, plastic BGA (PBGA) packages, tape BGA (TBGA) packages, metal BGA (MBGA) packages, and fine pitch BGA (FPBGA) packages.

Semiconductor device packages are becoming lighter, thinner, shorter, and smaller. For this reason, most adhesive materials used to adhere a semiconductor chip (or die) to a PCB are changing to film-type materials that advantageously provide a lower profile of the semiconductor device package and are suitable for a thin semiconductor wafer. However, defects may occur in the case where a film-type adhesive material is used. One of the typical defects is a swelling phenomenon, which is due to the delamination resulting from a void formed at the boundary between the semiconductor chip and the PCB. The swelling phenomenon has an adverse effect on the reliability of the package. The swelling phenomenon occurring between the lowermost semiconductor chip of a stacked chip semiconductor device package and the PCB is the most common defect occurring in the semiconductor device package. The present invention addresses these and other disadvantages of the conventional art.

SUMMARY

Exemplary embodiments of the present invention are directed to a semiconductor device chip package. In an exemplary embodiment, the semiconductor device chip package may include: a semiconductor chip including bonding pads; a printed circuit board (PCB) including an insulation pattern with a groove and bonding electrodes corresponding to the bonding pads, the groove corresponding to the edge of the semiconductor chip and being formed to partially expose a lower portion of the edge of the semiconductor chip; an adhesive material provided for adhering the bottom of the semiconductor chip to the insulation pattern to mount the semiconductor chip on the PCB; bonding wires provided for electrically connecting the bonding electrodes to the corresponding bonding pads; and a molding material provided for sealing the PCB, the semiconductor chip, the adhesive material, and the bonding wires.

DETAILED DESCRIPTION

Figure 1A:
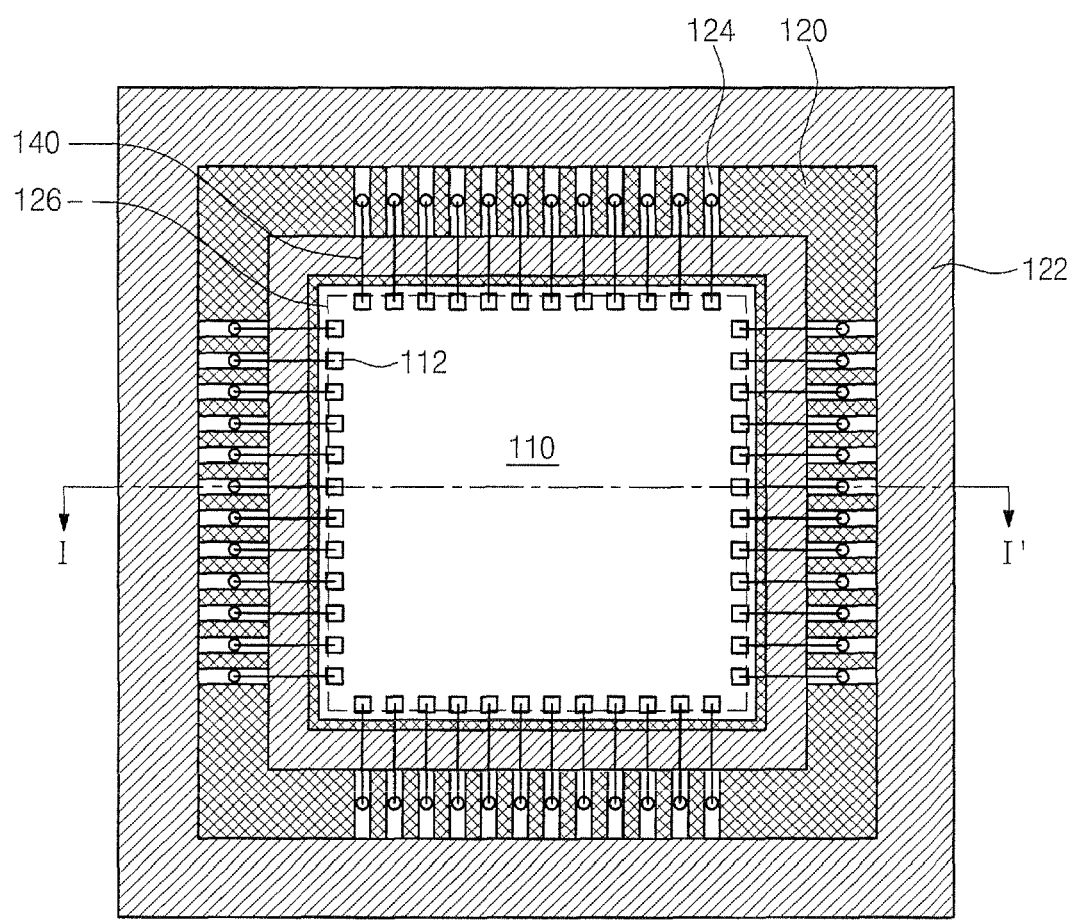
FIG. 1A is a top plan view illustrating a semiconductor chip package according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numbers refer to like elements throughout.

Figure 1B:
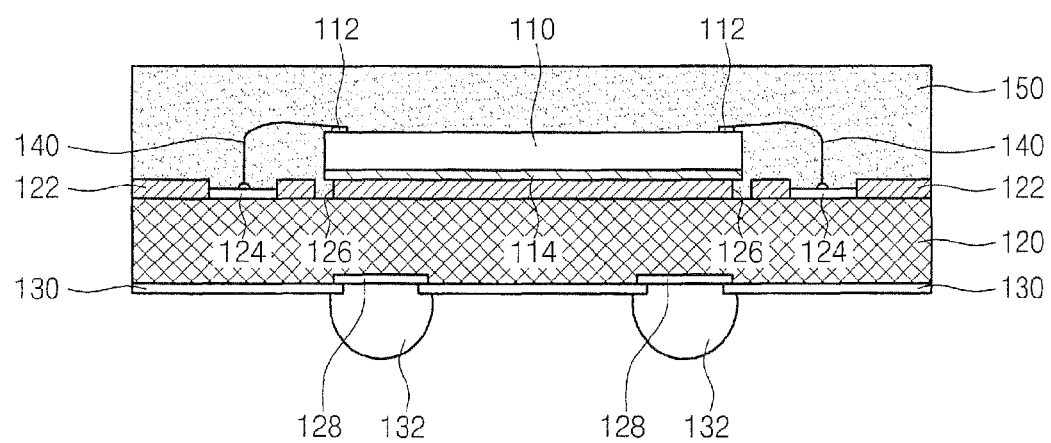
FIG. 1B is a cross-sectional view taken along the line I-I' of FIG. 1A.

FIG. 1A is a top plan view illustrating a semiconductor chip package according to an embodiment of the present invention, and FIG. 1B is a cross-sectional view taken along the line I-I' of FIG. 1A.

Referring to FIGS. 1A and 1B, the semiconductor chip package includes a semiconductor chip 110, a printed circuit board (PCB) 120, an adhesive material 114, bonding wires 140, and a molding material 150. The semiconductor chip 110 includes bonding pads 112, which are disposed on the upper surface of the semiconductor chip 110. The PCB 120 includes an insulation pattern 122 and bonding electrodes 124, which are disposed on the upper surface of the PCB 120. The insulation pattern 122 includes a groove 126, which corresponds to the edge of the semiconductor chip 110 and is formed to expose a lower portion of the edge of the semiconductor chip 110. The bonding electrodes 124 correspond to the bonding pads 112. The adhesive material 114 is used to adhere the bottom of the semiconductor chip 110 to the insulation pattern 122, mounting the semiconductor chip 110 on the PCB 120. The bonding wires 140 are provided to electrically connect the bonding electrodes 124 to the corresponding bonding pads 112. The molding material 150 is used to seal the PCB 120, the semiconductor chip 110, the adhesive material 114, and the bonding wires 140. Reference numerals 128, 130, and 132 represent joint electrodes 128, an insulation material 130, and solder balls 132, respectively, for a connection terminal provided to electrically connect the ball grid array package type PCB 120, on which the semiconductor chip 110 is mounted, to an underlying main board.

The semiconductor chip 110 may be mounted on the PCB 120, including the upper surface on which the insulation pattern 122 is provided, by the adhesive material 114. The insulation pattern 122 may be a photo solder resist (PSR). The adhesive material 114 may be a film-type material, which advantageously provides a lower profile of a semiconductor device package and is suitable for a thin semiconductor wafer.

The groove 126 may be formed to partially expose a lower portion of the edge of the semiconductor chip 110 and to expose the PCB 120 at the same time. During a process of mounting the semiconductor chip 110 on the PCB 120, the groove 126 serves to offer a path along which a void formed at the boundary between the semiconductor chip 110 and the PCB 120 may be discharged. Therefore, the formation of a void may be suppressed at the boundary between the semiconductor chip 110 and the PCB 120 during the process of mounting the semiconductor chip 110 on the PCB 120.

In the case where the semiconductor chip 110 is rectangular, the groove 126 may be a closed rectangular groove formed to partially expose a lower portion of the edge of the semiconductor chip 110 and to expose the PCB 120 at the same time. As illustrated in FIG. 1A, the groove 126 is formed to partially expose lower portions of all side edges of the semiconductor chip 110 and to expose the PCB 120 at the same time.

In order to electrically connect the semiconductor chip 110 to the PCB 120, the bonding pads 112 provided on the semiconductor chip 110 may be wire bonded to the bonding electrodes 124 spaced apart from the semiconductor chip 110 by means of the bonding wires 140 made of conductive metal lines. The bonding electrodes 124 are arranged around the semiconductor chip 110 to be used as terminals for electrical connection to the exterior.

The molding material 150 may seal the PCB 120, the semiconductor chip 110, the adhesive material 114, and the boding wires 140 to fully cover the PCB 120 on which the semiconductor chip 110 is mounted. The molding material 150 may be epoxy molding compound (EMC).

The groove 126 may be formed at a position so as to change the flow of the molding material 150 during a process of sealing the molding material 150. Thus, during the process of sealing the molding material 150, the groove 126 serves to prevent incomplete molding caused by a difference between a flow rate at an area where the semiconductor chip 110 of the PCB 120 is mounted and a flow rate at an area where the semiconductor chip 110 of the PCB 120 is not mounted. Moreover, the molding material 150 fills the groove 126 to prevent the swelling phenomenon where a void formed at the boundary between the semiconductor chip 110 and the PCB 120 absorbs external water ($H_2O$) and gas so as to be swollen. In addition, since the molding material 150 has a higher adhesion force to the PCB 120 than the insulation pattern 122, a locking effect of the molding material 150 may be enhanced.

TABLE 1

| Condition Type | Reliability Estimation Condition Temperature, Humidity, Time | Reflow Condition Highest Temperature | Number of Tested Packages | Number of Swelling Occurrence |
| --- | --- | --- | --- | --- |
| 0 | 85° C., 85%, 24 Hr | 260° C. | 180 | 0 |
| 1 | 85° C., 85%, 48 Hr | 260° C. | 180 | 0 |
| 2 | 85° C., 65%, 168 Hr | 260° C. | 180 | 0 |

The table [TABLE 1] shows the conditions and the result of a pre-confirm test for estimating reliability of semiconductor chip packages. The pre-confirm test is conducted from level "0" to level "2". The levels "0", "1", and "2" may include extreme environmental conditions each having temperature, humidity, and time. A reflow process is carried out for semiconductor chip packages subjected to the extreme environmental conditions. In this case, the highest temperature of the reflow process is 260 degrees centigrade. The extreme environmental conditions and the reflow process are designed to expedite the swelling phenomenon so that defects can be identified.

As shown through the pre-confirm test of the level "2", no defect occurs at a number of semiconductor chip packages (180 semiconductor chip packages) according to the present invention. Thus, it may be concluded that the semiconductor chip packages according to the present invention prevent the swelling phenomenon occurring between the semiconductor chip 110 and the PCB 120.

Figure 2A:
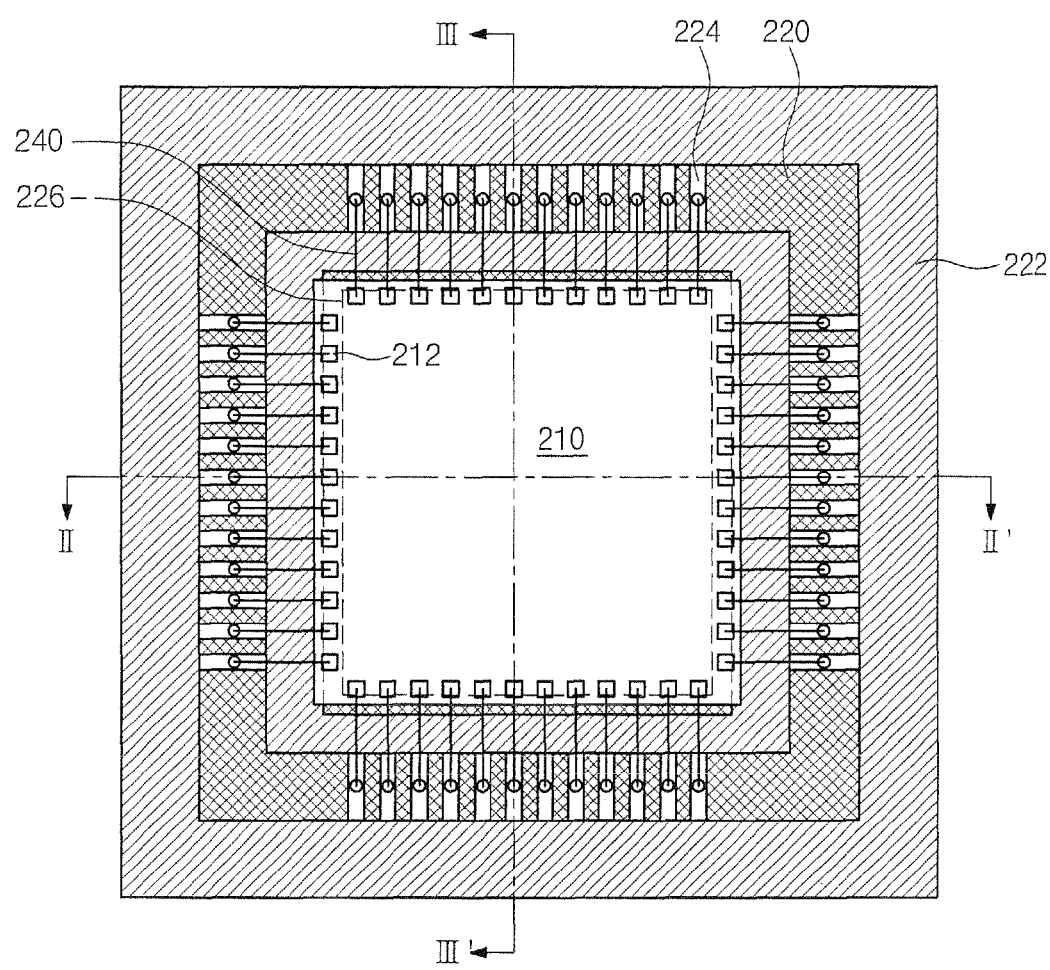
FIG. 2A is a top plan view illustrating a semiconductor chip package according to another embodiment of the present invention.
Figure 2B:
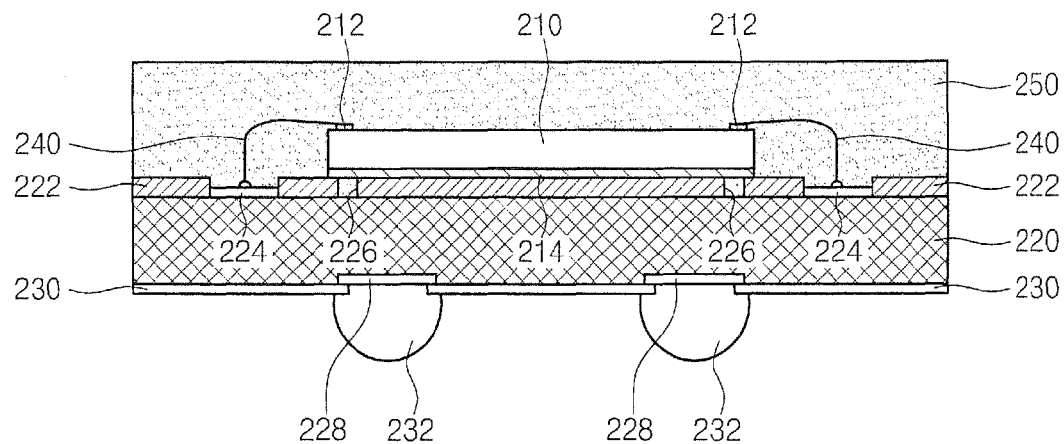
FIGS. 2B and 2C are cross-sectional views taken along the lines II-II' and III-III' of FIG. 2A, respectively.
Figure 2C:
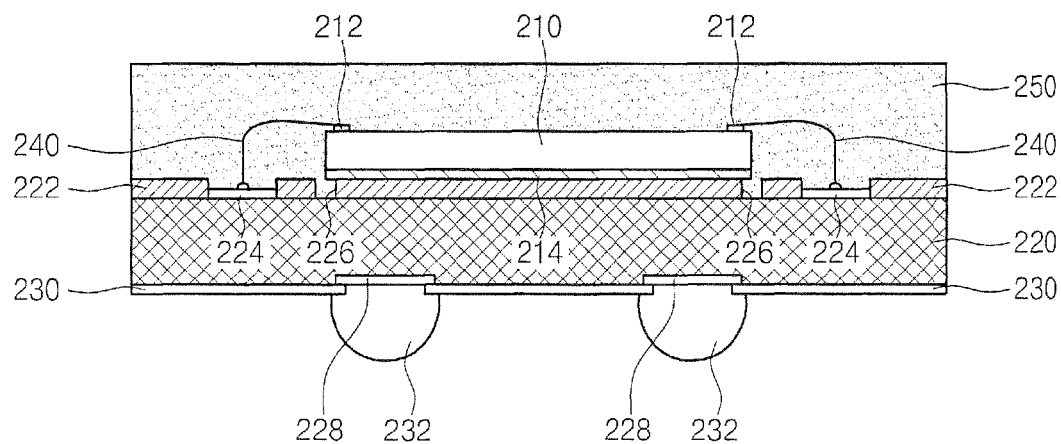

FIG. 2A is a top plan view illustrating a semiconductor chip package according to another embodiment of the present invention. FIGS. 2B and 2C are cross-sectional views taken along the lines II-II' and III-III' of FIG. 2A, respectively.

Referring to FIGS. 2A through 2C, the semiconductor chip package includes a semiconductor chip 210, a printed circuit board (PCB) 220, an adhesive material 214, bonding wires 240, and a molding material 250. The semiconductor chip 210 includes bonding pads 212, which are disposed on the upper surface of the semiconductor chip 210. The PCB 220 includes an insulation pattern 222 and bonding electrodes 224, which are disposed on the upper surface of the PCB 220. The insulation pattern 222 includes a groove 226, which corresponds to the edge of the semiconductor chip 210 and is formed to expose a lower portion of the edge of the semiconductor chip 210. The bonding electrodes 224 correspond to the bonding pads 212. The adhesive material 214 is used to adhere the bottom of the semiconductor chip 210 to the insulation pattern 222, mounting the semiconductor chip 210 on the PCB 220. The bonding wires 240 are provided to electrically connect the bonding electrodes 224 to the corresponding bonding pads 212. The molding material 250 is used to seal the PCB 220, the semiconductor chip 210, the adhesive material 214, and the bonding wires 240. Reference numerals 228, 230, and 232 represent joint electrodes 228, an insulation material 230, and solder balls 232, respectively, for a connection terminal provided to electrically connect the ball grid array package type PCB 220, on which the semiconductor chip 210 is mounted, to an underlying main board.

The semiconductor chip 210 may be mounted on the PCB 220, including the upper surface on which the insulation pattern 222 is provided, by the adhesive material 214. The insulation pattern 222 may be a photo solder resist (PSR). The adhesive material 214 may be a film-type material, which advantageously provides a lower profile of a semiconductor device package and is suitable for a thin semiconductor wafer.

The groove 226 may be formed to partially expose a lower portion of the edge of the semiconductor chip 210 and to expose the PCB 220 at the same time. During a process of mounting the semiconductor chip 210 on the PCB 220, the groove 226 serves to offer a path along which a void formed at the boundary between the semiconductor chip 210 and the PCB 220 may be discharged. Therefore, the formation of a void may be suppressed at the boundary between the semiconductor chip 210 and the PCB 220 during the process of mounting the semiconductor chip 210 on the PCB 220.

In the case where the semiconductor chip 210 is rectangular, the groove 226 may be a closed rectangular groove formed to partially expose a lower portion of at least one edge of the semiconductor chip 210 and to expose the PCB 220 at the same time. The groove 226 may be formed to partially expose a lower portion of at least one pair of opposite edges of the semiconductor chip 210 and the PCB 220 at the same time. As illustrated in FIG. 2A, the groove 226 may be formed to partially expose a lower portion of a pair of edges of the semiconductor chip 210 perpendicular to the line III-III' and to expose the PCB 220 at the same time.

The molding material 250 may seal the PCB 220, the semiconductor chip 210, the adhesive material 214, and the boding wires 240 to fully cover the PCB 220 on which the semiconductor chip 210 is mounted. The molding material 250 may be epoxy molding compound (EMC).

Figure 3A:
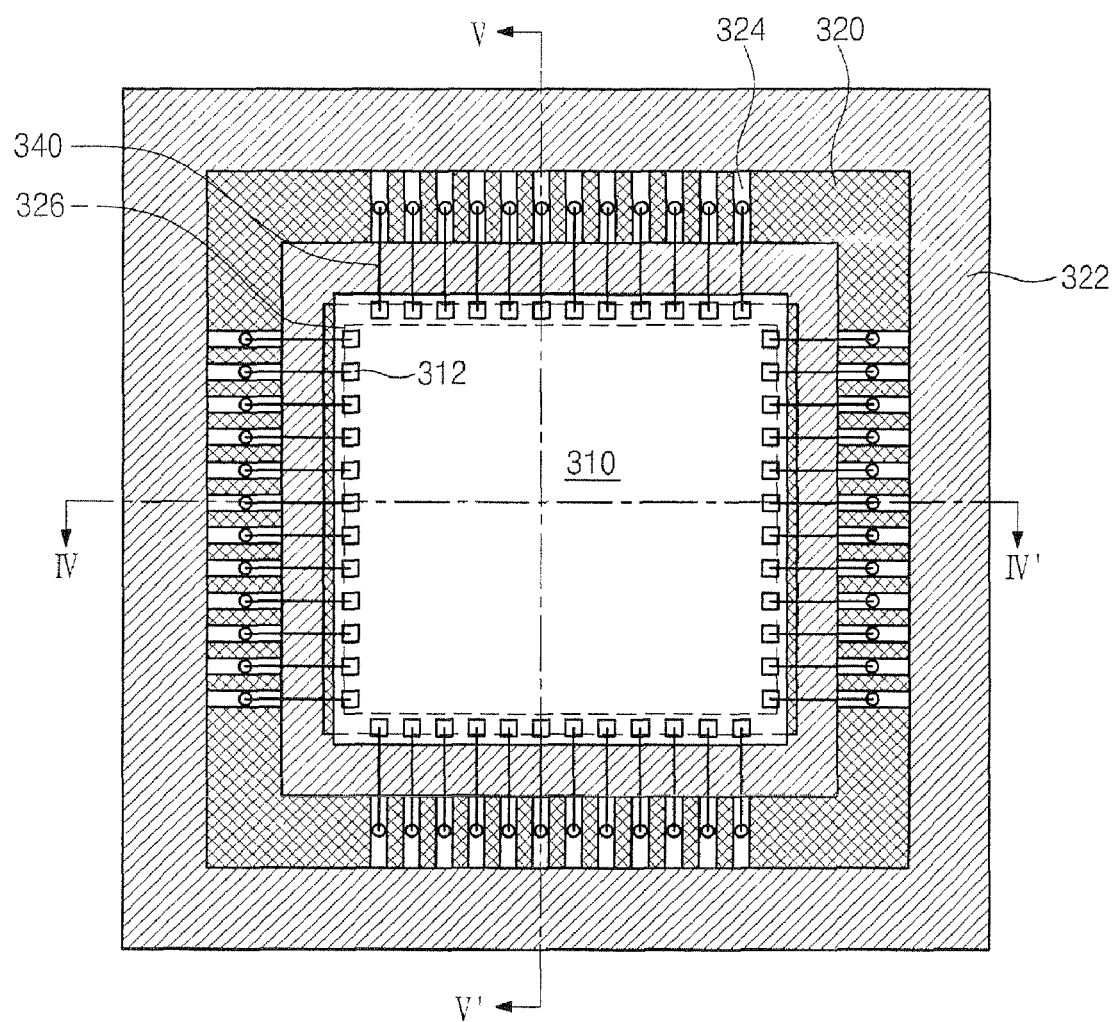
FIG. 3A is a top plan view illustrating a semiconductor chip package according to still another embodiment of the present invention.
Figure 3B:
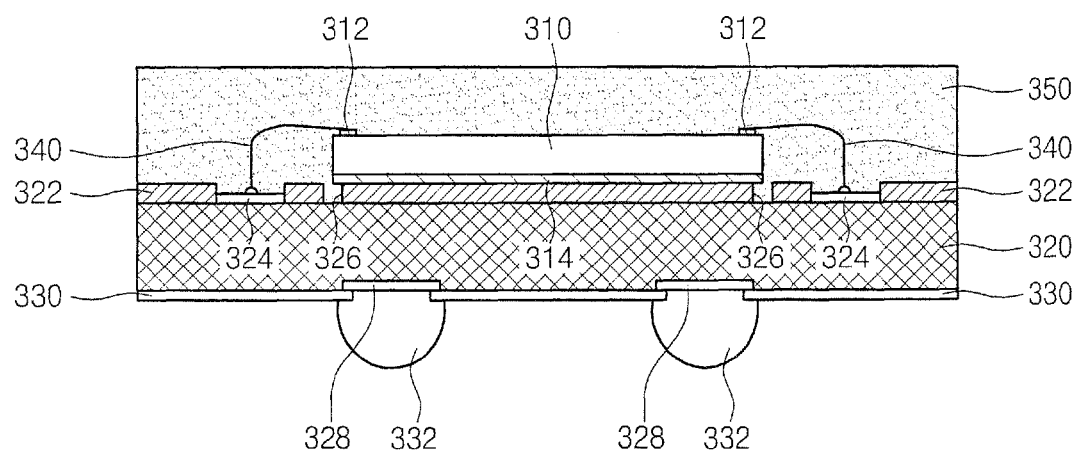
FIGS. 3B and 3C are cross-sectional views taken along the lines IV-IV' and V-V' of FIG. 3A, respectively.
Figure 3C:
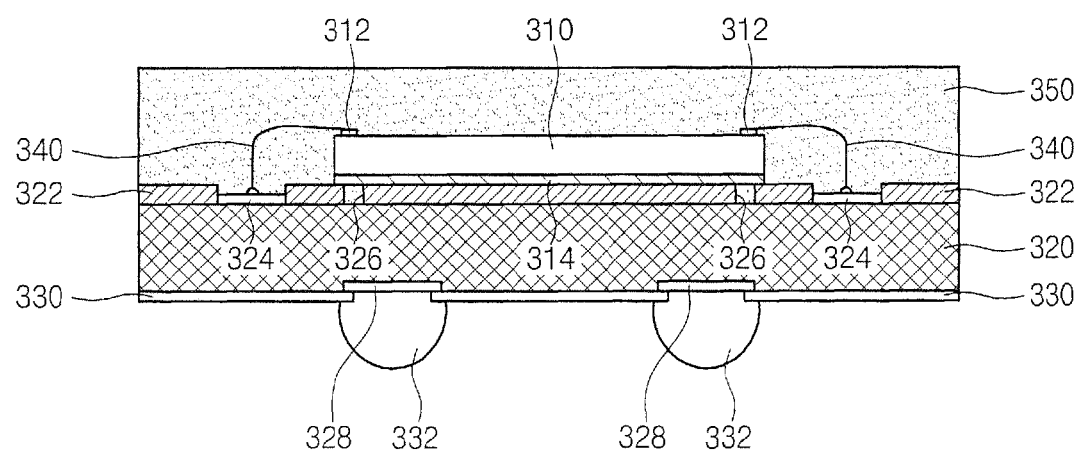

FIG. 3A is a top plan view illustrating a semiconductor chip package according to still another embodiment of the present invention. FIGS. 3B and 3C are cross-sectional views taken along the lines IV-IV' and V-V' of FIG. 3A, respectively.

Referring to FIGS. 3A through 3C, the semiconductor chip package includes a semiconductor chip 310, a printed circuit board (PCB) 320, an adhesive material 314, bonding wires 340, and a molding material 350. The semiconductor chip 310 includes bonding pads 312, which are disposed on the upper surface of the semiconductor chip 310. The PCB 320 includes an insulation pattern 322 and bonding electrodes 324, which are disposed on the upper surface of the PCB 320. The insulation pattern 322 includes a groove 326, which corresponds to the edge of the semiconductor chip 310 and is formed to expose a lower portion of the edge of the semiconductor chip 310. The bonding electrodes 324 correspond to the bonding pads 312. The adhesive material 314 is used to adhere the bottom of the semiconductor chip 310 to the insulation pattern 322 mounting the semiconductor chip 310 on the PCB 320. The bonding wires 340 are provided to electrically connect the bonding electrodes 324 to the corresponding bonding pads 312. The molding material 350 is used to seal the PCB 320, the semiconductor chip 310, the adhesive material 314, and the bonding wires 340. Reference numerals 328, 330, and 332 represent joint electrodes 328, an insulation material 330, and solder balls 332, respectively, for a connection terminal provided to electrically connect the ball grid array package type PCB 320, on which the semiconductor chip 310 is mounted, to an underlying main board.

The semiconductor chip 310 may be mounted on the PCB 320, including the upper surface on which the insulation pattern 322 is provided, by the adhesive material 314. The insulation pattern 322 may be a photo solder resist (PSR). The adhesive material 314 may be a film-type material, which advantageously provides a lower profile of a semiconductor device package and is suitable for a thin semiconductor wafer.

The groove 326 may be formed to partially expose a lower portion of the edge of the semiconductor chip 310 and to expose the PCB 320 at the same time. During a process of mounting the semiconductor chip 310 on the PCB 320, the groove 326 serves to offer a path along which a void formed at the boundary between the semiconductor chip 310 and the PCB 320 may be discharged. Therefore, the formation of a void may be suppressed at the boundary between the semiconductor chip 310 and the PCB 320 during the process of mounting the semiconductor chip 310 on the PCB 320.

In the case where the semiconductor chip 310 is rectangular, the groove 326 may be a closed rectangular groove formed to partially expose a lower portion of at least one edge of the semiconductor chip 310 and to expose the PCB 320 at the same time. The groove 326 may be formed to partially expose a lower portion of at least one pair of opposite edges of the semiconductor chip 310 and the PCB 320 at the same time. As illustrated in FIG. 3A, the groove 326 may be formed to partially expose a lower portion of a pair of edges of the semiconductor chip 310 perpendicular to the line IV-IV' and to expose the PCB 320 at the same time.

The molding material 350 may seal the PCB 320, the semiconductor chip 310, the adhesive material 314, and the boding wires 340 to fully cover the PCB 320 on which the semiconductor chip 310 is mounted. The molding material 350 may be epoxy molding compound (EMC).

Figure 4A:
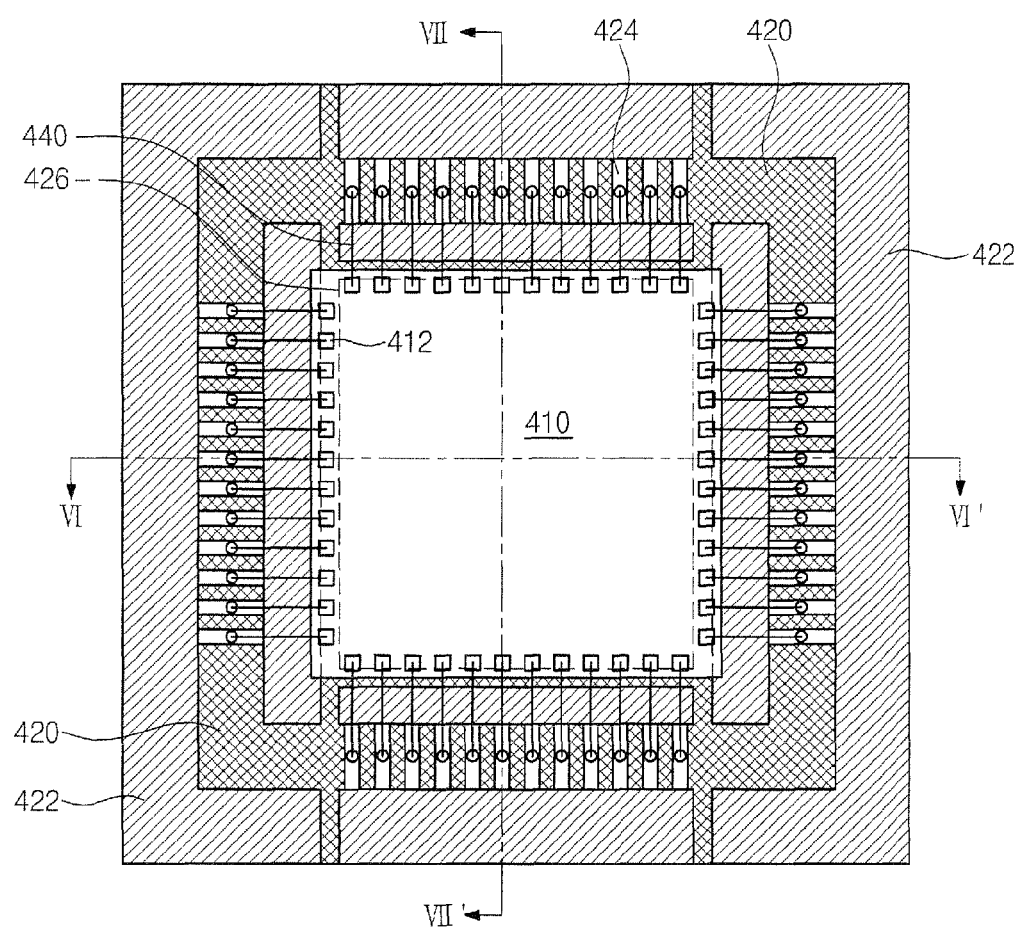
FIG. 4A is a top plan view illustrating a semiconductor chip package according to yet another embodiment of the present invention.
Figure 4B:
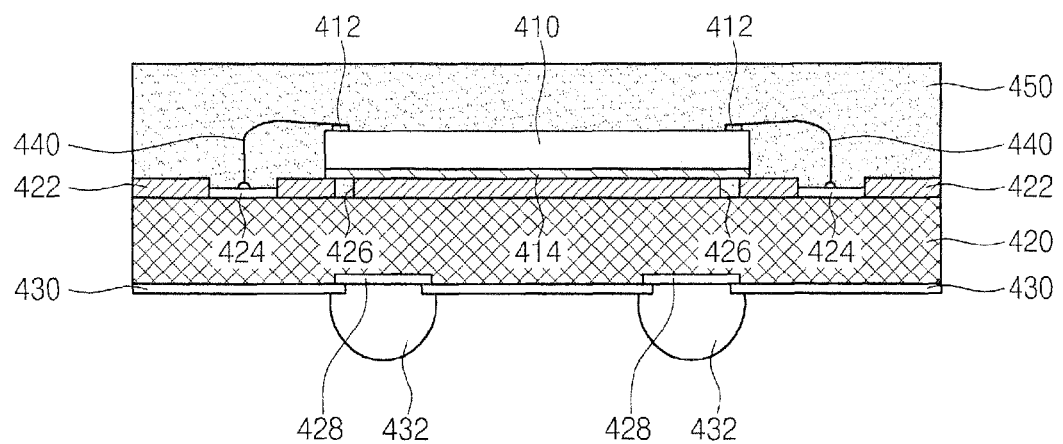
FIGS. 4B and 4C are cross-sectional views taken along the lines VI-VI' and VII-VII' of FIG. 4A, respectively.
Figure 4C:
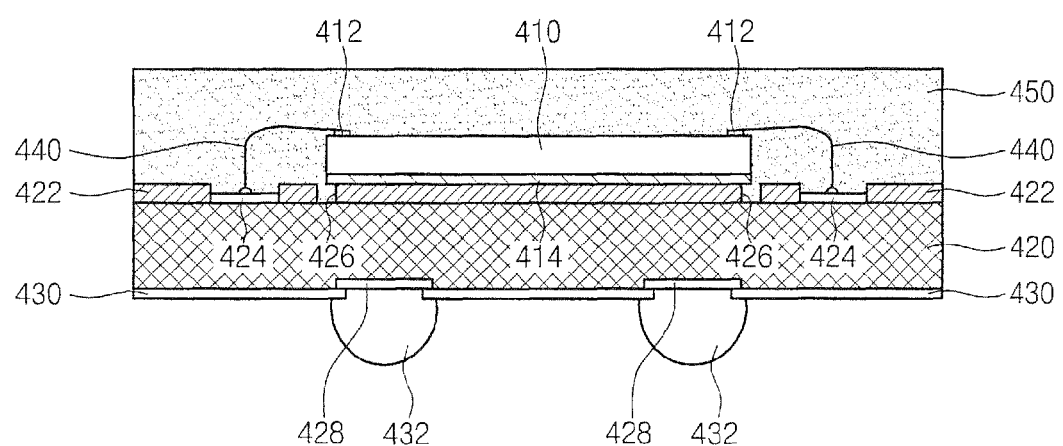

FIG. 4A is a top plan view illustrating a semiconductor chip package according to yet another embodiment of the present invention. FIGS. 4B and 4C are cross-sectional views taken along the lines VI-VI' and VII-VII' of FIG. 4A, respectively.

Referring to FIGS. 4A through 4C, the semiconductor chip package includes a semiconductor chip 410, a printed circuit board (PCB) 420, an adhesive material 414, bonding wires 440, and a molding material 450. The semiconductor chip 410 includes bonding pads 412, which are disposed on the upper surface of the semiconductor chip 410. The PCB 420 includes an insulation pattern 422 and bonding electrodes 424, which are disposed on the upper surface of the PCB 420. The insulation pattern 422 includes a groove 426, which corresponds to the edge of the semiconductor chip 410 and is formed to expose a lower portion of the edge of the semiconductor chip 410. The bonding electrodes 424 correspond to the bonding pads 412. The adhesive material 414 is used to adhere the bottom of the semiconductor chip 410 to the insulation pattern 422, mounting the semiconductor chip 410 on the PCB 420. The bonding wires 440 are provided to electrically connect the bonding electrodes 424 to the corresponding bonding pads 412. The molding material 450 is used to seal the PCB 420, the semiconductor chip 410, the adhesive material 414, and the bonding wires 440. Reference numerals 428, 430, and 432 represent joint electrodes 428, an insulation material 430, and solder balls 432, respectively, for a connection terminal provided to electrically connect the ball grid array package type PCB 420, on which the semiconductor chip 410 is mounted, to an underlying main board.

The semiconductor chip 410 may be mounted on the PCB 420, including the upper surface on which the insulation pattern 422 is provided, by the adhesive material 414. The insulation pattern 422 may be a photo solder resist (PSR). The adhesive material 414 may be a film-type material, which advantageously provides a lower profile of a semiconductor device package and is suitable for a thin semiconductor wafer.

The groove 426 may be formed to partially expose a lower portion of the edge of the semiconductor chip 410 and to expose the PCB 420 at the same time. During a process of mounting the semiconductor chip 410 on the PCB 420, the groove 426 serves to offer a path along which a void formed at the boundary between the semiconductor chip 410 and the PCB 420 may be discharged. Therefore, the formation of a void may be suppressed at the boundary between the semiconductor chip 410 and the PCB 420 during the process of mounting the semiconductor chip 410 on the PCB 420.

In the case where the semiconductor chip 410 is rectangular, the groove 426 may be a closed rectangular groove formed to partially expose a lower portion of at least one edge of the semiconductor chip 410 and to expose the PCB 420 at the same time. The closed rectangular groove includes at least one extension portion extending in an edge direction of the PCB 420. The groove 426 may be formed to partially expose a lower portion of at least one pair of opposite edges of the semiconductor chip 410 and the PCB 420 at the same time. As illustrated in FIG. 4A, the groove 426 may be formed to partially expose a lower portion of a pair of edges of the semiconductor chip 410 perpendicular to the line VII-VII' and to expose the PCB 420 at the same time. Also the groove 426 may extend at the edge of the semiconductor chip 410 in a length direction to further expose a PCB 420 adjacent to a region where the bonding electrodes 424 are formed.

The molding material 450 may seal the PCB 420, the semiconductor chip 410, the adhesive material 414, and the boding wires 440 to fully cover the PCB 420 on which the semiconductor chip 410 is mounted. The molding material 450 may be epoxy molding compound (EMC).

Figure 5A:
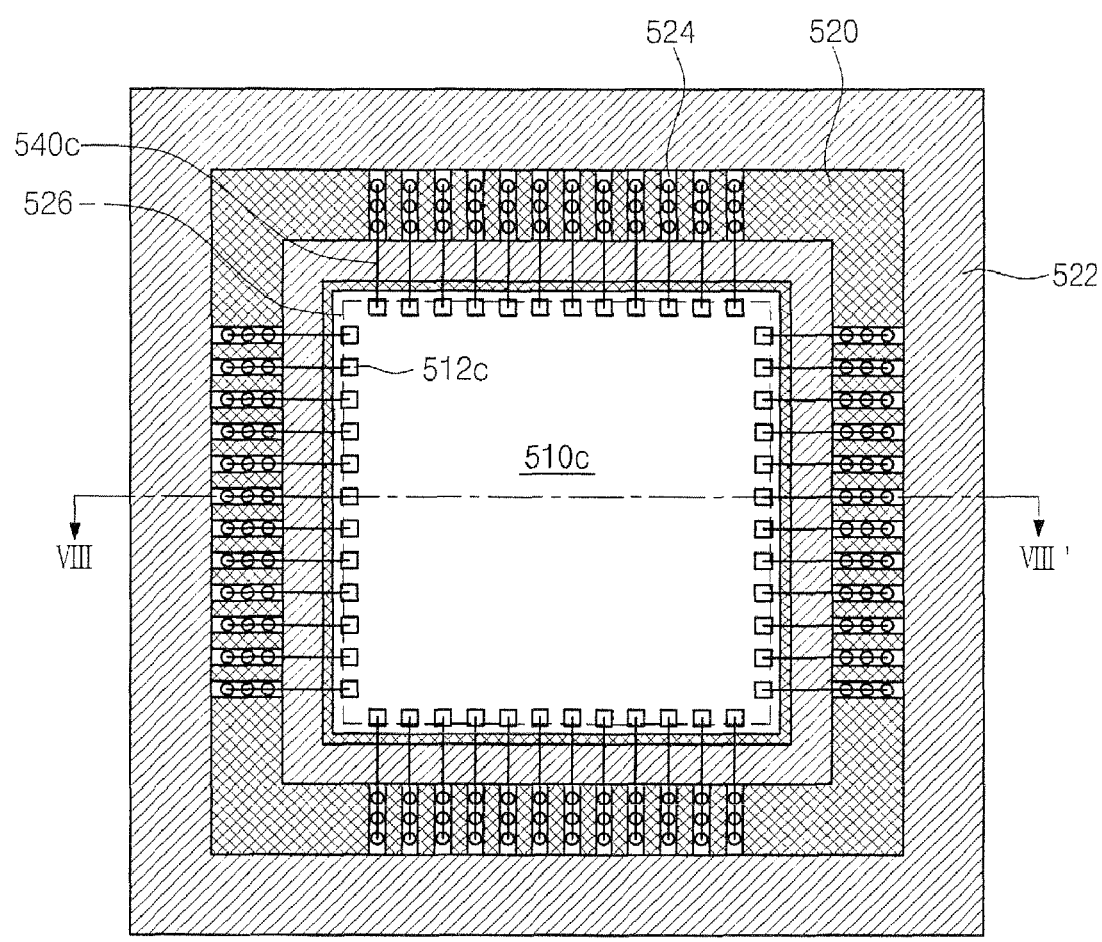
FIG. 5A is a top plan view illustrating a stacked chip semiconductor device package according to some embodiments of the present invention.
Figure 5B:
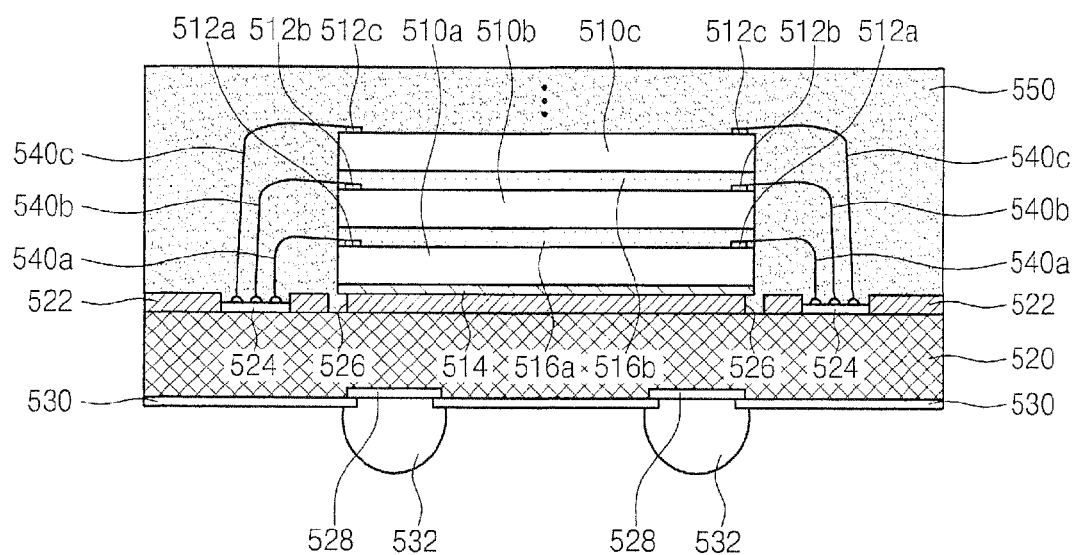
FIG. 5B is a cross-sectional view taken along the line VIII-VIII' of FIG. 5A.

FIG. 5A is a top plan view illustrating a stacked chip semiconductor device package according to some embodiments of the present invention, and FIG. 5B is a cross-sectional view taken along the line VIII-VIII' of FIG. 5A.

Referring to FIGS. 5A and 5B, the stacked chip semiconductor device package includes stacked semiconductor chips 510a, 510b, 510c, etc., a printed circuit board (PCB) 520, an adhesive material 514, bonding wires 540a, 540b, and 540c, and a molding material 550. The stacked semiconductor chips 510a, 510b, 510c, etc., include bonding pads 512a, 512b, 512c, etc., which are disposed on the upper surface of the stacked semiconductor chips 510a, 510b, 510c, etc., respectively. The PCB 520 includes an insulation pattern 522 and bonding electrodes 524. The insulation pattern 522 includes a groove 526, which corresponds to the edge of an overlying lowermost semiconductor chip 510a and is formed to partially expose a lower portion of the edge of the lowermost semiconductor chip 510a. The bonding electrodes 524 correspond to bonding pads 512a, 512b, 512c, etc., respectively. The adhesive material 514 is used to adhere the bottom of the lowermost semiconductor chip 510a to the insulation pattern 522, mounting the stacked semiconductor chips 510a, 510b, 510c, etc. on the PCB 520. The bonding wires 540a, 540b, and 540c are provided to electrically connect the bonding electrodes 324 to the corresponding bonding pads 512a, 512b, and 512c, respectively. The molding material 550 is used to seal the PCB 520, the stacked semiconductor chips 510a, 510b, 510c, etc., the adhesive material 514, and the bonding wires 540a, 540b, and 540c. Reference numerals 516a and 516b represent inter-chip adhesive materials 516a and 516b used to adhere the stacked semiconductor chips 510a, 510b, and 510c, to each other, respectively. Reference numerals 528, 530, and 532 represent joint electrodes 528, an insulation material 530, and solder balls 532, respectively, for a connection terminal provided to electrically connect the ball grid array package type PCB 520, on which the stacked semiconductor chips 510a, 510b, 510c, etc. are mounted, to an underlying main board.

The stacked semiconductor chips 510a, 510b, 510c, etc. may be mounted on the PCB 520, including the upper surface on which the insulation pattern 522 is provided, by the adhesive material 514. The insulation pattern 522 may be a photo solder resist (PSR). The adhesive material 514 may be a film-type material, which advantageously provides a lower profile of a semiconductor device package and is suitable for a thin semiconductor wafer. The inter-chip adhesive materials 516a and 516b, which are used to adhere the stacked semiconductor chips 510a, 510b, and 510c, to each other, may each include a film-type adhesive material or an epoxy-group material having an adhesive property.

The groove 526 may be formed to partially expose a lower portion of the edge of a lowermost semiconductor chip 510a and to expose the PCB 520 at the same time. During a process of mounting the stacked semiconductor chips 510a, 510b, 510c, etc. on the PCB 520, the groove 526 serves to offer a path along which a void formed at the boundary between the lowermost semiconductor chip 510a and the PCB 520 may be discharged. Therefore, the formation of a void may be suppressed at the boundary between the lowermost semiconductor chip 510a and the PCB 520 during the process of mounting the stacked semiconductor chips 510a, 510b, 510c, etc. on the PCB 520.

In the case where the lowermost semiconductor chip 510a is rectangular, the groove 526 may be a closed rectangular groove formed to partially expose a lower portion of at least one edge of the lowermost semiconductor chip 510a and to expose the PCB 520 at the same time or a groove including at least one extension portion extending in an edge direction of the PCB 520. As illustrated in FIG. 5A, the groove 526 may be formed to partially expose a lower portion of edges of all sides of the lowermost semiconductor chip 510a and to expose the PCB 520 at the same time.

Bonding pads 512b and 512c of additional semiconductor chips 510b and 510c stacked on the lowermost semiconductor chip 510a may be connected to a selected one of the bonding pads 512a and 512b or the corresponding bonding electrodes 524 underlying the lowermost semiconductor chips 510a. As illustrated in FIG. 5A, the bonding pads 512a, 512b, and 512c, of the stacked semiconductor chips 510a, 510b, and 510c, may be connected to corresponding bonding electrodes 524.

The molding material 550 may seal the PCB 520, the stacked semiconductor chips 510a, 510b, 510c, etc., the adhesive material 514, and the boding wires 540a, 540b, and 540c to fully cover the PCB 520 on which the stacked semiconductor chips 510a, 510b, 510c, etc. are mounted. The molding material 550 may be epoxy molding compound (EMC).

According to the foregoing embodiments of the present invention, a semiconductor device package is provided to offer a space along which a void is discharged during a process of adhering a semiconductor chip on a printed circuit board (PCB). Thus, a swelling phenomenon occurring between the semiconductor chip and the PCB is suppressed to achieve a reliable semiconductor device package.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A semiconductor device package comprising:
   a semiconductor chip including bonding pads and an adhesive material on a lower portion of the semiconductor chip;
   a printed circuit board (PCB) including an insulation pattern with a groove and bonding electrodes, the groove at least partially covered with the adhesive material, the semiconductor chip mounted on the PCB, wherein the groove includes at least one extension portion extending through the insulation pattern to an outer edge of the PCB in a longitudinal direction of the groove;
   bonding wires electrically connecting the bonding electrodes to the corresponding bonding pads; and
   a molding material sealing the PCB, the semiconductor chip, and the bonding wires.

2. The semiconductor device package of claim 1, wherein the insulation pattern is photo solder resist.

3. The semiconductor device package of claim 1, wherein the groove is configured to expose the PCB.

4. The semiconductor device package of claim 3, wherein the semiconductor chip is rectangular, and at least a portion of the groove is partially covered by the adhesive material and exposes the PCB.

5. The semiconductor device package of claim 4, wherein at least one pair of opposite portions of the groove is partially covered by the adhesive material and exposes the PCB.

6. The semiconductor device package of claim 1, wherein the adhesive material is a film-type material.

7. The semiconductor device package of claim 1, wherein the molding material is an epoxy molding compound.

8. The semiconductor device package of claim 1, further comprising:
   at least one additional semiconductor chip stacked on the semiconductor chip and including bonding pads.

9. The semiconductor device package of claim 8, wherein each of the bonding pads of the additional semiconductor chip are connected to a selected one of the corresponding bonding pads of the semiconductor chip or the corresponding bonding electrodes.

10. The semiconductor device package of claim 8, further comprising an inter-chip adhesive material disposed between the semiconductor chip and the additional semiconductor chip.

11. A semiconductor device package comprising:
    a printed circuit board (PCB) including bonding electrodes;
    an insulation pattern disposed on an upper surface of the PCB, wherein the insulation pattern includes a groove exposing a portion of the PCB;
    a semiconductor chip disposed on the insulation pattern, the semiconductor chip including bonding pads;
    an adhesive material disposed between the semiconductor chip and the insulation pattern;
    bonding wires electrically connecting the bonding electrodes to the bonding pads; and
    a molding material substantially enclosing the insulation pattern, the semiconductor chip, the adhesive material, and the bonding wires,
    wherein the groove exposes a lower portion of at least one edge of the semiconductor chip, wherein the groove extends outwardly from at least one edge of the semiconductor chip, and wherein the groove includes at least one extension portion extending through the insulation pattern to an outer edge of the PCB in a longitudinal direction of the groove.

12. The semiconductor device package of claim 11, further comprising:
    one or more joint electrodes disposed on a lower surface of the PCB;
    an insulation material disposed on the lower surface of the PCB; and
    one or more solder balls attached to the joint electrodes.

13. The semiconductor device package of claim 11, wherein the groove exposes lower portions of at least one pair of opposite edges of the semiconductor chip.

14. A semiconductor device package comprising:
    a printed circuit board (PCB) including bonding electrodes;
    an insulation pattern disposed on an upper surface of the PCB, wherein the insulation pattern includes a groove exposing a portion of the PCB;
    a lowermost semiconductor chip disposed on the insulation pattern, the lowermost semiconductor chip including first bonding pads;
    one or more additional semiconductor chips stacked on the lowermost semiconductor chip, the additional semiconductor chips including second bonding pads;
    an adhesive material disposed between the lowermost semiconductor chip and the insulation pattern;
    an inter-chip adhesive material disposed between the lowermost semiconductor chip and the additional semiconductor chips;
    first bonding wires electrically connecting the bonding electrodes to the first bonding pads;
    second bonding wires electrically connecting the second bonding pads to a selected one of the corresponding first bonding pads or the corresponding bonding electrodes; and
    a molding material substantially enclosing the insulation pattern, the lowermost semiconductor chip, the additional semiconductor chips, the adhesive material, the inter-chip adhesive material, the first bonding wires, and the second bonding wires,
    wherein the groove exposes a lower portion of at least one edge of the lowermost semiconductor chip, wherein the groove extends outwardly from at least one edge of the lowermost semiconductor chip, and wherein the groove includes at least one extension portion extending through the insulation pattern to an outer edge of the PCB in a longitudinal direction of the groove.

15. The semiconductor device package of claim 14, further comprising:
    one or more joint electrodes disposed on a lower surface of the PCB;
    an insulation material disposed on the lower surface of the PCB; and
    one or more solder balls attached to the joint electrodes.

16. The semiconductor device package of claim 14, wherein the groove exposes lower portions of at least one pair of opposite edges of the lowermost semiconductor chip.

* * * * *